United States Patent
Park et al.

(10) Patent No.: US 11,384,437 B2
(45) Date of Patent: Jul. 12, 2022

(54) ETCHANT COMPOSITION AND FORMING METHOD OF WIRING USING ETCHANT COMPOSITION

(71) Applicant: Samsung Display Co., Ltd., Yongin-si (KR)

(72) Inventors: Jong Hee Park, Yongin-si (KR); Jin Seock Kim, Yongin-si (KR); Bong Won Lee, Yongin-si (KR); Sang-woo Kim, Seongnam-si (KR); Il-Ryong Park, Gimcheon-si (KR); Bong-Yeon Won, Gimpo-si (KR); Dae-woo Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/854,342

(22) Filed: Apr. 21, 2020

(65) Prior Publication Data

US 2020/0248318 A1 Aug. 6, 2020

Related U.S. Application Data

(62) Division of application No. 15/970,980, filed on May 4, 2018, now abandoned.

(30) Foreign Application Priority Data

Jun. 22, 2017 (KR) .......................... 10-2017-0079346

(51) Int. Cl.
*C09K 13/06* (2006.01)
*C23F 1/16* (2006.01)
(Continued)

(52) U.S. Cl.
CPC .................. *C23F 1/30* (2013.01); *C23F 1/02* (2013.01); *H01L 21/32134* (2013.01);
(Continued)

(58) Field of Classification Search
CPC .................................. C09K 13/06; C23F 1/16
See application file for complete search history.

(56) References Cited

U.S. PATENT DOCUMENTS

| 6,284,721 | B1 * | 9/2001 | Lee | .......................... C03C 15/00 134/2 |
| 6,901,938 | B2 * | 6/2005 | Sato | .......................... B08B 1/04 134/100.1 |

(Continued)

FOREIGN PATENT DOCUMENTS

| CN | 102939407 | 2/2013 |
| CN | 105316677 | 2/2016 |

(Continued)

OTHER PUBLICATIONS

Chinese Office Action for Chinese Patent Application or Patent No. 201810637712.2, dated Sep. 27, 2021.

(Continued)

*Primary Examiner* — Thomas T Pham
(74) *Attorney, Agent, or Firm* — Kile Park Reed & Houtteman PLLC

(57) ABSTRACT

A phosphoric acid-free etchant composition and a method of forming a wiring, the composition including about 40 wt % to about 60 wt % of an organic acid compound; about 6 wt % to about 12 wt % of a glycol compound; about 1 wt % to about 10 wt % of nitric acid, sulfuric acid, or hydrochloric acid; about 1 wt % to about 10 wt % of a nitrate salt compound; and water, all wt % being based on a total weight of the phosphoric acid-free etchant composition.

19 Claims, 3 Drawing Sheets

(51) Int. Cl.
*C23F 1/30* (2006.01)
*H01L 21/3213* (2006.01)
*C23F 1/02* (2006.01)
*H05K 3/06* (2006.01)
*H01L 27/12* (2006.01)
*H01L 29/786* (2006.01)

(52) U.S. Cl.
CPC ......... *H01L 27/1244* (2013.01); *H05K 3/067* (2013.01); *H01L 29/7869* (2013.01)

(56) References Cited

U.S. PATENT DOCUMENTS

| | | | |
|---|---|---|---|
| 8,377,325 | B2 | 2/2013 | Suh et al. |
| 2014/0235064 | A1* | 8/2014 | Matsui .............. H01L 21/30604 438/753 |
| 2015/0218709 | A1 | 8/2015 | Yoshizaki |
| 2016/0053382 | A1 | 2/2016 | Jung et al. |
| 2016/0177457 | A1 | 6/2016 | Yokomizo et al. |

FOREIGN PATENT DOCUMENTS

| | | |
|---|---|---|
| CN | 105316678 | 2/2016 |
| CN | 106011861 | 10/2016 |
| JP | 6-57453 | 3/1994 |
| JP | 4957584 | 6/2012 |
| JP | 2014-051576 | 3/2014 |
| JP | 5921091 | 5/2016 |
| KR | 10-2009-0051583 | 5/2009 |
| KR | 10-2010-0048144 | 5/2010 |
| KR | 10-1391603 | 5/2014 |
| KR | 10-2014-0118491 | 10/2014 |
| KR | 10-2016-0025081 | 3/2016 |
| KR | 10-2016-0115189 | 6/2016 |
| KR | 10-2016-0084284 | 7/2016 |
| KR | 10-2016-0100591 | 8/2016 |
| KR | 10-2016-0108944 | 9/2016 |

OTHER PUBLICATIONS

Korean Notice of Allowance for Korean Patent Application or Patent No. 10-2017-0079346, dated Apr. 15, 2022.

* cited by examiner

ETCHANT COMPOSITION AND FORMING METHOD OF WIRING USING ETCHANT COMPOSITION

CROSS-REFERENCE TO RELATED APPLICATION

This is a divisional application based on currently pending U.S. patent application Ser. No. 15/970,980, filed May 4, 2018, the disclosure of which is incorporated herein by reference in its entirety. U.S. patent application Ser. No. 15/970,980 claims priority benefit of Korean Patent Application No. 10-2017-0079346 under 35 U.S.C. § 119, filed on Jun. 22, 2017 in the Korean Intellectual Property Office, the disclosure of which is incorporated herein by reference in its entirety for all purposes.

BACKGROUND

1. Field

Embodiments relate to an etchant composition and a forming method of a wiring using an etchant composition.

2. Description of the Related Art

Flat panel display devices have been in the limelight because they can be made into lightweight and thin. The flat panel display device includes various display devices such as a liquid crystal display device, an organic light emitting display device, and the like. The flat panel display device may include pixels arranged in a matrix form. The flat panel display device may include a thin film transistor array substrate including various elements for driving pixels.

SUMMARY

Embodiments are directed to an etchant composition and a forming method of a wiring using an etchant composition.

The embodiments may be realized by providing a phosphoric acid-free etchant composition including about 40 wt % to about 60 wt % of an organic acid compound; about 6 wt % to about 12 wt % of a glycol compound; about 1 wt % to about 10 wt % of nitric acid, sulfuric acid, or hydrochloric acid; about 1 wt % to about 10 wt % of a nitrate salt compound; and water, all wt % being based on a total weight of the phosphoric acid-free etchant composition.

The etchant composition may further include about 1 wt % to about 5 wt % of a chelate compound.

The organic acid compound may include at least three different organic acids.

The organic acid compound may include acetic acid ($CH_3CO_2H$), malic acid ($C_4H_6O_5$), citric acid ($C_6H_8O_7$), tartaric acid ($C_4H_6O_6$), lactic acid ($C_3H_6O_3$), methyl sulfonic acid ($CH_4O_3S$), formic acid ($CH_2O_2$), succinic acid ($C_4H_6O_4$), or fumaric acid ($C_4H_4O_4$).

The glycol compound may include a compound represented by Chemical Formula 1.

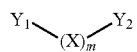

[Chemical Formula 1]

wherein, in Chemical Formula 1, each of $Y_1$ and $Y_2$ is H or —OH, at least one of $Y_1$ and $Y_2$ being —OH, X is a $C_1$-$C_{20}$ group, the $C_1$-$C_{20}$ group including —$CR_2$—, —C≡C—, —$CF_2O$—, —CR=CR—, —CO—, —O—, —CO—O—, —O—CO—, or —O—CO—O— in such a way that oxygen atoms are not directly connected to each other, R being —H, a halogen, or —OH, and m is a natural number of 1 to 20.

The nitrate salt compound may include aluminum nitrate ($Al(NO_3)_3$), ammonium nitrate ($NH_4NO_3$), calcium nitrate ($Ca(NO_3)_2$), copper nitrate ($Cu(NO_3)_2$), indium nitrate ($In(NO_3)_3$), iron nitrate ($Fe(NO_3)_3$), lithium nitrate ($LiNO_3$), potassium nitrate ($KNO_3$), silver nitrate ($AgNO_3$), or sodium nitrate ($NaNO_3$).

The chelate compound may include citric acid ($C_6H_8O_7$), diethanolamine ($C_4H_{11}NO_2$), diethylenetriamine pentaacetic acid ($C_{14}H_{23}N_3O_{10}$), ethylenediaminetetraacetic acid ($C_{10}H_{16}N_2O_8$), ethylenediamine ($C_2H_8N_2$), iminodiacetic acid ($C_4H_7NO_4$), ethanolamine ($C_2H_7NO$), or malonic acid ($C_3H_4O_4$.).

The phosphoric acid-free etchant composition may be formulated to etch a thin film including a single layer made of silver or a silver alloy.

The thin film may further include an indium oxide layer, and the indium oxide layer may include indium tin oxide (ITO), indium zinc oxide (IZO), indium tin zinc oxide (ITZO), or indium gallium zinc oxide (IGZO).

The embodiments may be realized by providing a method of forming a wiring, the method including forming a thin film on a substrate; and etching the thin film in a predetermined wiring shape using the etchant composition, wherein the etchant composition is a phosphoric acid-free etchant composition that includes about 40 wt % to about 60 wt % of an organic acid compound; about 6 wt % to about 12 wt % of a glycol compound; about 1 wt % to about 10 wt % of nitric acid, sulfuric acid, or hydrochloric acid; about 1 wt % to about 10 wt % of a nitrate salt compound; and water, all wt % being based on a total weight of the phosphoric acid-free etchant composition.

The thin film may include a single layer made of silver or a silver alloy.

The thin film may further include a indium oxide layer, and the indium oxide layer may include indium tin oxide (ITO), indium zinc oxide (IZO), indium tin zinc oxide (ITZO), or indium gallium zinc oxide (IGZO).

The thin film may include an indium oxide layer/silver, an indium oxide layer/a silver alloy, an indium oxide layer/silver/an indium oxide layer, or an indium oxide layer/a silver alloy/an indium oxide layer.

The silver alloy may include silver (Ag) and nickel (Ni), copper (Cu), zinc (Zn), manganese (Mn), chromium (Cr), tin (Sn), palladium (Pd), neodymium (Nd), niobium (Nb), molybdenum (Mo), magnesium (Mg), tungsten (W), protactinium (Pa), aluminum (Al), or titanium (Ti).

The substrate may be tilted to have an angle of about 0 to about 60 degrees during the etching of the thin film.

The organic acid compound may include at least three different organic acids.

The organic acid compound may include acetic acid ($CH_3CO_2H$), malic acid ($C_4H_6O_5$), citric acid ($C_6H_8O_7$), tartaric acid ($C_4H_6O_6$), lactic acid ($C_3H_6O_3$), methyl sulfonic acid ($CH_4O_3S$), formic acid ($CH_2O_2$), succinic acid ($C_4H_6O_4$), or fumaric acid ($C_4H_4O_4$).

The method may further include forming a mask on the thin film according to a shape of the wiring, prior to etching the thin film.

The thin film may include a first layer made of silver or a silver alloy; and at least one second layer provided on or under the first layer and including indium oxide, the method may further include etching the second layer, the phosphoric acid-free etchant composition may etch the first layer, and an etchant for etching the second layer may be different from the phosphoric acid-free etchant composition.

The etchant for etching the second layer may not etch the first layer and the phosphoric acid-free etchant composition may not etch the second layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
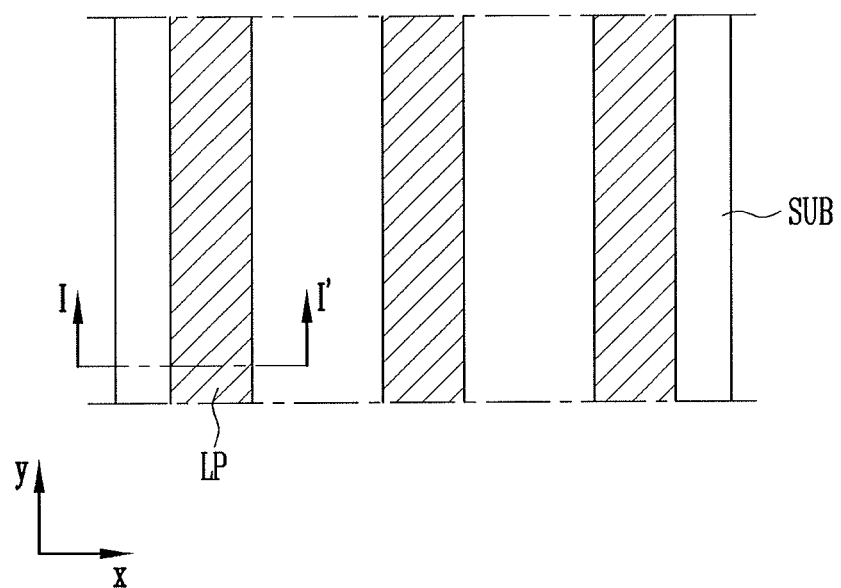
FIG. 1 illustrates a plan view of a wiring according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Like reference numerals designate like elements throughout the specification. In the accompanying drawings, dimensions of structures are exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the words "include," "comprise," or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and include a side direction or a lower direction. In contrast, It will be understood that when an element such as a layer, film, region, or substrate is referred to as being "beneath" another element, it can be directly beneath the other element or intervening elements may also be present.

In the present specification, the terms 'upper side' and 'lower side' are used in a relative sense in order to facilitate understanding of the technical idea of the present invention. Thus, the terms 'upper side' and 'lower side' do not refer to a particular direction, position, or element, and are interchangeable. For example, 'upper side' may be interpreted as 'lower side', and 'lower side' may be interpreted as 'upper side'. Therefore, 'upper side' may be expressed as 'first side', 'lower side' may be expressed as 'second side', 'lower side' may be expressed as 'first side', and 'upper side' may be expressed as 'second side'. However, in one exemplary embodiment, 'upper side' and 'lower side' are not mixed.

Figure 2:
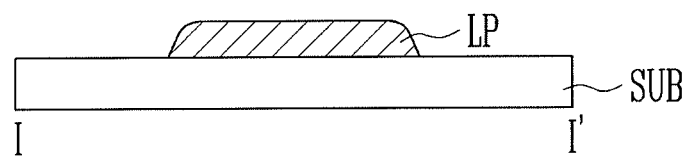
FIG. 2 illustrates a cross-sectional view taken along a line in FIG. 1.

FIG. 1 illustrates a plan view of a wiring according to an exemplary embodiment. In addition, FIG. 2 illustrates a cross-sectional view taken along a line I-I' in FIG. 1.

Referring to FIG. 1, a wiring LP according to an exemplary embodiment may be provided on a substrate SUB in an arbitrary or predetermined shape or form. The number and shape of the wiring LP shown in FIG. 1 are merely illustrative. In an implementation, the wiring LP may be provided in more or fewer numbers than those shown in FIG. 1. In an implementation, the shape of the wiring LP may be a straight line, a curved line, a curved shape, and the shapes of the wiring LP provided on the substrate may not be all the same. In FIG. 1, for convenience of description, the wiring LP extending in a y-axis direction will be described. In an implementation, the shape of the wiring LP may change depending on the function of the wiring LP in an electronic device such as a display device.

According to an exemplary embodiment, the wiring LP may constitute a pad unit of the display device. A plurality of wirings LP extending from a plurality of pixels in the display device may be collected in the pad unit of the display device. Therefore, the pad unit of the display device may have a complicated structure including a plurality of wirings LP. The pad unit may perform the function of electrically connecting the different components in the display device, and it may be desirable that the wiring LP included in the pad unit is in a form capable of ensuring stable electrical connection. In an implementation, the wiring LP of a complicated structure may be arranged in a form capable of ensuring stable electrical connection.

The wiring LP constituting the pad unit may include a single layer or a multilayer made of silver or a silver alloy. In this case, the single layer including silver may include not only pure silver but also a silver alloy. The silver alloy may include, e.g., silver (Ag) and nickel (Ni), copper (Cu), zinc (Zn), manganese (Mn), chromium (Cr), tin (Sn), palladium (Pd), neodymium (Nd), niobium (Nb), molybdenum (Mo), magnesium (Mg), tungsten (W), protactinium (Pa), aluminum (Al), or titanium (Ti). The kind and proportion of elements included in the silver alloy may change depending on the use of the wiring LP.

The multilayer may include a single layer made of silver or a silver alloy and an indium oxide layer. A plurality of single layers made of silver or a silver alloy and a plurality of indium oxide layers may be present in the multilayer. In an implementation, the wiring LP according to an exemplary embodiment may include a multilayer composed of, e.g., an indium oxide layer/silver/an indium oxide layer/a silver alloy, a multilayer composed of an indium oxide layer/silver/an indium oxide layer, or a multilayer composed of an indium oxide layer/a silver alloy/an indium oxide layer.

The indium oxide layer may include, e.g., indium tin oxide (ITO), indium zinc oxide (IZO), indium tin zinc oxide (ITZO), or indium gallium zinc oxide (IGZO). The kind of the indium oxide layer may be changed depending on the use of the wiring LP, the kind of the silver alloy provided together with the indium oxide layer, and the like.

A multilayer including a single layer made of silver or a silver alloy and an indium oxide layer may be transparent and has excellent conductivity. In the case of a multilayer composed of an indium oxide layer/silver/an indium oxide layer, each indium oxide layer may have a thickness of, e.g., about 50 Å to about 500 Å. In an implementation, a single layer made of silver may have a thickness of, e.g., about 50 Å to about 500 Å. Maintaining the thickness of a single layer made of an indium oxide layer or silver at about 50 Å or greater may help secure sufficient conductivity. Maintaining the thickness of a single layer made of an indium oxide layer or silver at about 500 Å or less may help ensure that the efficiency of the etching process is not deteriorated, and may help ensure that patterning of the wiring LP is performed properly.

The etching method may be divided into dry etching and a wet etching. The dry etching refers to an etching method using plasma or an activated gas. The dry etching may include sputter etching using sputtering, reactive ion etching, and vapor etching. The wet etching refers to an etching method using a liquid etchant composition. The wet etching may be performed by spraying the liquid etchant composition onto the object to be etched, or by dipping the object to be etched in the liquid etchant composition.

A manufacturing method of the wiring LP according to an embodiment may include a wet etching process. When wet etching is performed, an etchant used in the etching process of a single layer or multilayer made of silver or a silver alloy could react with a metal electrode under the single layer or the multilayer. For example, in the case of the pad unit, an insulating layer may not be provided between the metal electrode and the single layer or the multilayer, and there may be a high possibility that the metal electrode and the etchant composition contact each other. It could be difficult to prevent a lower metal electrode and the etchant composition from contacting each other during the etching process. In an effort to help reduce or prevent an unnecessary reaction between the metal electrode and the etchant composition, an etchant composition having low reactivity with the metal electrode may be used.

Some etching processes may be performed using an etchant composition including phosphoric acid ($H_3PO_4$). The etchant composition including phosphoric acid may react with the lower metal electrode during the etching process of a single layer or multilayer made of silver or a silver alloy. Therefore, the etchant composition including phosphoric acid may etch the metal electrode in the etching process of the single layer or the multilayer. In this case, the metal electrode may have a different shape from a designed shape, and thus the wiring LP may not function properly. This may occur frequently in the pad unit in which the wiring LP having a complicated structure is disposed.

According to an exemplary embodiment, the etchant composition may be a phosphoric acid-free etchant composition including no phosphoric acid ($H_3PO_4$). The term "phosphoric acid-free etchant composition" in the present application means that phosphoric acid is not included in the composition.

The etchant composition according to an exemplary embodiment may include, e.g., an organic acid compound, a glycol compound, at least one inorganic acid compound (e.g., nitric acid, sulfuric acid, or hydrochloric acid), a nitrate salt compound, and water. The inorganic acid compound may react with a single layer made of silver or a silver alloy to oxidize the single layer. The inorganic acid compound may include nitric acid, sulfuric acid, and/or hydrochloric acid as described above. When a mixture of two or more materials selected from nitric acid, sulfuric acid, and hydrochloric acid is used, a mixing ratio thereof may be selected according to the kind of a single layer made of silver or a silver alloy. In an implementation, the inorganic acid compound may be included in the etchant composition in an amount of, e.g., about 1 wt % to about 10 wt %. Maintaining the amount of the inorganic acid compound at about 1 wt % or greater may help ensure that the single layer made of silver or a silver alloy is etched sufficiently.

Maintaining the amount of the inorganic acid compound at about 10 wt % or greater may help ensure that the etching reaction is not excessively active, thus helping to prevent over-etching of that the single layer made of silver or a silver alloy.

In addition, as described above, the etchant composition according to an embodiment may include at least one inorganic acid selected from nitric acid, sulfuric acid, and hydrochloric acid, and phosphoric acid is not included in the etchant composition. An etchant composition including phosphoric acid is unsuitable for use in the process in which form a nano-sized wiring, such as silver nano-wire AgNW, due to their relatively high viscosity. For example, an etchant composition including phosphoric acid may have a viscosity of about 10 cP or more at room temperature (25° C.). Such an etchant composition having a relatively high viscosity may be relatively difficult to coat on a substrate or a thin film, and thus may be unsuitable for forming a wiring having a fine and complicated pattern. In addition, when the process temperature is increased to increase the viscosity of the etchant composition including phosphoric acid, the substrate or the thin film may be damaged. The etchant composition including no phosphoric acid and including at least one inorganic acid selected from nitric acid, sulfuric acid, and hydrochloric acid may have a relatively low viscosity and is therefore suitable for forming a wiring having a fine and complicated pattern.

The organic acid may assist the inorganic acid to etch a single layer of silver or a silver alloy. If the etching process of a single layer made of silver or a silver alloy is repeatedly performed, the inorganic acid in the etchant composition could be decomposed and the etching ability may be deteriorated. Therefore, if the etch process is to be repeatedly performed, the etchant composition could be periodically replaced. However, frequent replacement of the etchant composition may increase process costs and deteriorate process efficiency. According to an exemplary embodiment, the organic acid in the etchant composition may help prevent deterioration of the etching ability of the inorganic acid due to the reaction with silver or a silver alloy. Accordingly, the etchant composition according to an embodiment (including the organic acid) may be suitable for use in a repetitive etching process, and the process costs may be reduced as the replacement period of the etchant composition is increased.

In an implementation, the organic acid may be included in the etchant composition in an amount of, e.g., about 40 wt % to about 60 wt %. Maintaining the amount of the organic acid in the etchant composition at about 40 wt % or greater may help ensure that the effect of preventing decomposition of the inorganic acid compound or preventing the deterioration of the etching ability is sufficiently obtained. Maintaining the amount of the organic acid in the etchant composition at about 60 w % or less may help ensure that the etching reaction is not excessively active, thereby preventing over-etching of the single layer made of silver or a silver alloy.

The organic acid may include, e.g., acetic acid ($CH_3CO_2H$), malic acid ($C_4H_6O_5$), citric acid ($C_6H_8O_7$), tartaric acid ($C_4H_6O_6$), lactic acid ($C_3H_6O_3$), methyl sulfonic acid ($CH_4O_3S$), formic acid ($CH_2O_2$), succinic acid ($C_4H_6O_4$), or fumaric acid ($C_4H_4O_4$).

In an implementation, the organic acid may include at least three different organic acids. In case of mixing different kinds of organic acids, the etching ability may be improved as compared with the case of using a single kind of organic acid. The etching ability of the single kind of organic acid may increase as the concentration of the organic acid increases, but the etching ability may converge or level off at a specific concentration. Therefore, in the case where various kinds of organic acids are mixed to have a concentration less than the convergence value of the etching ability of each of organic acids, the etching ability may be superior to the case of using the single kind of organic acid having a concentration greater than the convergence value of the etching ability. The kind and mixing ratio of the organic acid may change or be selected according to the composition of a single layer made of silver or a silver alloy, the kind of inorganic acid, and the like.

The glycol compound may function to activate the organic acid in the etchant composition. The organic acid may be often in a solid state at room temperature. In the wet etching process, the etchant composition may be sprayed in a liquid state, and it may be important to dissolve the organic acid in a liquid etchant composition in order for the organic acid to function properly in the wet etching process. The glycol compound may cause the organic acid to dissolve in the liquid etchant composition and to be thus activated. For example, the glycol compound may include two or more hydroxyl groups (—OH) in the molecule. In an implementation, the glycol compound according to an embodiment may include not only a material having two hydroxyl groups (—OH) but also a material having three or more hydroxyl groups (—OH). In an implementation, the glycol compound may include a material having both one hydroxy group (—OH) and one carboxyl group (—COOH).

In an implementation, the glycol compound may include a compound represented by Chemical Formula 1.

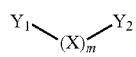

[Chemical Formula 1]

In Chemical Formula 1, each of $Y_1$ and $Y_2$ may be, e.g., H or —OH. In an implementation, at least one of $Y_1$ and $Y_2$ may be —OH. In an implementation, both of $Y_1$ and $Y_2$ may be —OH. X may be, e.g., a $C_1$-$C_{20}$ group. In an implementation, the $C_1$-$C_{20}$ group may include or may not include an unsaturated bond (e.g., such that the $C_1$-$C_{20}$ group may be an alkyl group, an alkenyl group, or an alkynyl group. In an implementation, a —$CH_2$— moiety in the $C_1$-$C_{20}$ group may be substituted or replaced with —C≡C—, —$CF_2O$—, —CH=CH—, —CO—, —O—, —CO—O—, —O—CO— or —O—CO—O— in such a way that oxygen atoms are not directly connected to each other (e.g., such that the $C_1$-$C_{20}$ group may be an alkenyl, an alkynyl, a ketone, an ether, an ester, or the like). In an implementation, a hydrogen atom (—H) of the $C_1$-$C_{20}$ group substituted or replaced with a halogen or —OH. In an implementation, m may be a natural number of 1 to 20. For example, X may be a $C_1$-$C_{20}$ group, the $C_1$-$C_{20}$ group including —$CR_2$—, —C≡C—, —$CF_2O$—, —CR=CR—, —CO—, —O—, —CO—O—, —O—CO—, or —O—CO—O— in such a way that oxygen atoms are not directly connected to each other, R being —H, a halogen, or —OH.

As described above, the glycol compound may have two or more hydroxy groups in the molecule, and all of the case where both of $Y_1$ and $Y_2$ are hydroxy groups, the case where either of $Y_1$ and $Y_2$ is a hydroxyl group and —H of —$CH_2$— in X is substituted with —OH, and the case where both of $Y_1$ and $Y_2$ are hydroxyl groups and —H of —$CH_2$— in X is substituted with —OH in Chemical Formula 1, may be included in the glycol compound of an embodiment. In an implementation, the glycol compound may include, e.g., diethylene glycol ($C_4H_{10}O_3$), ethylene glycol ($HOCH_2CH_2OH$), glycolic acid ($CH_2OHCOOH$), propylene glycol ($C_3H_9O_2$), triethylene glycol ($C_6H_{14}O_4$), or the like.

In an implementation, the glycol compound may be included in the etchant composition in an amount of, e.g., about 6 wt % to about 12 wt %. Maintaining the amount of the glycol compound in the etchant composition at about 6 wt % or greater may help ensure that the glycol compound is able to sufficiently activate the organic acid in a solid state. Therefore, the decomposition of the inorganic acid may be sufficiently prevented, and the etching ability may be sufficiently obtained. Maintaining the amount of the glycol compound in the etchant composition at about 12 wt % or less may help ensure that the etching rate of the single layer made of silver or a silver alloy does not become too fast, thereby reducing the possibility of defects such as overetching.

The nitrate salt compound may assist the inorganic acid to etch a single layer made of silver or a silver alloy and may help prevent the inorganic acid from decomposing in a repetitive etching process, together with the organic acid. Therefore, the etchant composition including the nitrate salt compound may help maintain the etching ability even when used in a repetitive etch process. Accordingly, the replacement cycle of the etchant composition may be increased, the process cost may be reduced, and the process efficiency may be increased.

In an implementation, the nitrate salt compound may include, e.g., aluminum nitrate($Al(NO_3)_3$), ammonium nitrate ($NH_4NO_3$), calcium nitrate ($Ca(NO_3)_2$), copper nitrate ($Cu(NO_3)_2$), indium nitrate ($In(NO_3)_3$), iron nitrate ($Fe(NO_3)_3$), lithium nitrate ($LiNO_3$), potassium nitrate ($KNO_3$), silver nitrate ($AgNO_3$), or sodium nitrate ($NaNO_3$).

The kind of the nitrate salt compound included in the etchant composition may be determined or selected in consideration of the composition of a single layer made of silver or a silver alloy, the kind of the inorganic acid, or the like. In an implementation, the nitrate salt compound may be included in the etchant composition in an amount of, e.g., about 1 wt % to about 10 wt %.

Maintaining the amount of the nitrate salt compound in the etchant composition at about 1 wt % or greater may help ensure that the inhibiting effect of the inorganic acid by the nitrate salt compound occurs, thereby preventing a significant deterioration in the stability of the etchant composition.

In an implementation, the etchant composition may further include a chelate compound. The chelate compound may form a coordinate bond with a silver ion to help prevent the silver ion from being precipitated. The silver ion (Ag+) may exist in the etchant composition after etching the single layer made of silver or a silver alloy. When the etchant composition including the silver ion meets a metal electrode, silver could precipitate depending on the ionization tendency of the metal included in the metal electrode. For example, when aluminum is included in the metal electrode, the following silver precipitation reaction could occur.

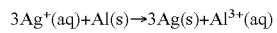

$$3Ag^+(aq)+Al(s) \rightarrow 3Ag(s)+Al^{3+}(aq)$$

Silver has a relatively small ionization tendency, and it may be precipitated when reacted with most metals. If the silver precipitated from the etchant composition were to be accumulated around the wiring LP, a short circuit between the wirings LP could occur due to silver.

In an etchant composition including phosphoric acid, the silver ion may bind with phosphate, thereby preventing precipitation of the silver ion. The etchant composition according to an embodiment does not include phosphoric acid, and the silver ion may exist in the etchant composition in an ionic state without coordinate bonding. The silver ion in the etchant composition could meet the metal electrode as described above, and thus silver could be precipitated in the wiring.

In an implementation, the silver ion in the etchant composition could cause problems when they are not precipitated in the form of silver particles (Ag(s)). For example, the silver ion in the etchant composition could react with an inorganic acid or organic acid to form silver oxide (AgO). The inorganic acid or the organic acid could lose the etching ability due to the oxidation reaction of silver oxide (AgO), and the etching ability of the total etchant composition could be deteriorated.

The chelate compound may form a coordinate bond with the silver ion, thereby preventing the silver from precipitating in the wiring and the oxidation reaction of silver oxide (AgO) from occurring. For example, the chelate compound may have a non-covalent electron pair in the molecule, and these non-covalent electron pairs may be provided to the silver ion (Ag+), so that the silver ion and the chelate compound may form the coordinate bond. The chelate compound may include, e.g., an amine group (—NH$_3$) having a non-covalent electron pair, a carboxyl group (—COOH), or the like. In an implementation, the chelate compound may include, e.g., citric acid (C$_6$H$_8$O$_7$), diethanolamine (C$_{41}$H$_{11}$NO$_2$), diethylenetriamine pentaacetic acid (C$_{14}$H$_{23}$N$_3$O$_{10}$), ethylenediaminetetraacetic acid (C$_{10}$H$_{16}$N$_2$O$_8$), ethylenediamine (C$_2$H$_8$N$_2$), iminodiacetic acid (C$_4$H$_7$NO$_4$), ethanolamine (C$_2$H$_7$NO), and malonic acid (C$_3$H$_4$O$_4$).

In an implementation, the chelate compound may be included in the etchant composition in an amount of, e.g., about 1 wt % to about 5 wt %. Maintaining the amount of the chelate compound in the etchant composition at about 1 wt % or greater may help ensure that the coordination bond between the chelate compound and the silver ion is sufficiently formed. Accordingly, the silver ion may not precipitate or react with the organic acid or the inorganic acid, thereby preventing a deterioration in the etching ability of the etchant composition. Maintaining the amount of the chelate compound in the etchant composition at about 5 wt % or less may help ensure that the chelate compound is not adsorbed on the surface of the single layer made of silver or a silver alloy, thereby preventing a remarkable deterioration in etching rate, and/or preventing a localized non-occurrence of the etching at a portion position of a single layer.

The etchant composition may include water (e.g., in a balance amount) in addition to the organic acid, the glycol compound, the inorganic acid, the nitrate salt compound, and the chelate compound as described above. The water included in the etchant composition may include, e.g., deionized water. The deionized water used for semiconductor process may have a resistivity value of 18 MO/cm or more.

In an implementation, the etchant composition according to an embodiment may further include, e.g., an etch control agent, a surfactant, a sequestering agent, a pH adjusting agent, or other additives, in addition to the above-mentioned components. The additive may be selected from suitable additive in order to further improve the effect of the embodiments.

In an implementation, the etchant composition according to an exemplary embodiment may include, e.g., 40 wt % to 60 wt % of the organic acid, 6 wt % to 12 wt % of the glycol compound, 1 wt % to 10 wt % of the inorganic acid (e.g., nitric acid, sulfuric acid, or hydrochloric acid), 1 wt % to 10 wt % of the nitrate salt compound, and water, with respect to a total weight of the composition. The etchant composition may etch only a single layer made of silver or a silver alloy. Therefore, when the etching process is performed using the etchant composition, a component other than a single layer made of silver or a silver alloy may not be etched. For example, when a metal electrode is provided on a substrate and a multilayer including a single layer made of a silver or silver alloy and an indium oxide layer is provided on the metal electrode, the etchant composition according to an embodiment may not etch the metal electrode or the indium oxide layer. The selective etching property for the silver or silver alloy may be obtained by combining the above-mentioned material in the composition ratio described above.

An etchant composition including phosphoric acid may etch not only a single layer made of silver or a silver alloy but also a metal electrode under the single layer. This phenomenon may be a problem especially in a formation process of the wiring provided in the pad unit. The wiring provided in the pad unit may have a form in which a single layer made of silver or a silver alloy and an indium oxide layer are sequentially stacked. In addition, a metal electrode may be provided under the wiring. No insulating layer or protective layer may be formed between the metal electrode and the single layer made of the silver or silver alloy, and the etchant composition for etching the single layer made of the silver or silver alloy may easily penetrate into the metal electrode thereunder. In this case, if the etchant composition were to include phosphoric acid, the phosphoric acid could react with the metal electrode to etch the metal electrode. In addition, a silver ion (Ag+) in the etchant composition including phosphoric acid may be precipitated on the metal electrode in this process. This is because an electron generated by etching the metal electrode may move to the silver ion (Ag+). Etching of the metal electrode or precipitation of the silver may cause a short circuit between the wirings and the like, which may cause defects. Such defects may easily occur as the structure of the wiring is more complicated and finer.

The etchant composition according to an embodiment does not include phosphoric acid, and the etching of the metal electrode described above does not occur. In addition, the etchant composition has the composition described above, and the single layer made of the silver or silver alloy may be easily etched without phosphoric acid. In addition, the etchant composition according to an embodiment does not include phosphoric acid, and the wiring is not over-etched by phosphoric acid.

FIGS. 3A to 3E illustrate cross-sectional views of stages in a method of forming a wiring according to an exemplary embodiment.

According to an exemplary embodiment, a forming method of a wiring may include forming a thin film on a substrate; and etching the thin film in a predetermined wiring shape using the etchant composition. The etchant composition may be a phosphoric acid-free etchant composition including 40 wt % to 60 wt % of an organic acid, 6 wt % to 12 wt % of a glycol compound, 1 wt % to 10 wt % of at least one inorganic acid (e.g., nitric acid, sulfuric acid, and/or hydrochloric acid), 1 wt % to 10 wt % of a nitrate salt compound, and water, with respect to a total weight of the etchant composition.

The details of the etchant composition in the forming method of the wiring according to an exemplary embodiment are as described above. Hereinafter, each step of the forming method of the wiring will be described in detail.

Figure 3A:
FIGS. 3A to 3E illustrate cross-sectional views of stages in a method of forming a wiring according to an exemplary embodiment.

FIG. 3A shows a cross-sectional view of a substrate SUB. The substrate SUB according to an exemplary embodiment may have a substantially quadrangle shape, e.g. a rectangular shape. In an implementation, the substrate SUB may have various suitable shapes. For example, the substrate SUB may have a closed polygon shape including a side made of a straight line, a circle, an ellipse, or the like including a side made of a curved line, and a semicircle, a semi-ellipse, and the like including a side made of a straight line and a curved line. In an implementation, when the substrate SUB has a side made of a straight line, at least one of the corners of each shape may be made of a curved line. For example, when the substrate SUB has a rectangular shape, the portion where the sides of the straight lines adjacent to each other meet may be replaced by a curved line having a predetermined curvature. For example, a vertex portion of the rectangular shape may be formed of a curved line in which both ends of the vertex portion adjacent to each other are connected to the sides of the straight lines adjacent to each other, and having a predetermined curvature. The curvature may be set differently depending on the position. For example, the curvature may change depending on the position at which the curved line starts and the length of the curved line.

The substrate SUB may be made of an insulating material such as glass, resin, and the like. In an implementation, the substrate SUB may be made of a material having flexibility so as to be bent or folded, and may have a single-layer structure or a multi-layer structure.

In an implementation, the substrate SUB may be made of, e.g., polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or polyurethane. In an implementation, the substrate SUB may be made of glass fiber reinforced plastic (FRP) or the like.

Figure 3B:
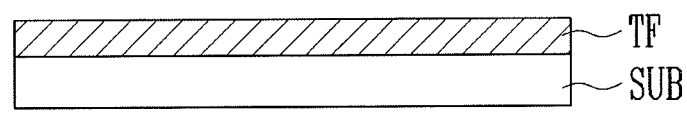

Referring to FIG. 3B, a thin film TF may be provided on the substrate SUB. The thin film may be coated on the substrates by a method such as a gravure coating, a roll coating, a comma coating, an air knife coating, a kiss coating, a spray coating, a suspension coating, an dipping coating, a spinner coating, a wheeler coating, a brushing, a front coating by a silk screen, a wire bar coating, a flow coating, an offset printing, a letterpress printing, and the like, or may be formed by a method such as thermal chemical vapor deposition (CVD), plasma enhanced chemical vapor deposition (PECVD), atmospheric pressure chemical vapor deposition (APCVD), low pressure chemical vapor deposition (LPCVD), thermal evaporation, electron beam evaporation, sputtering, atomic layer deposition (ALD), and the like.

The thin film TF may be a single layer made of silver or a silver alloy, or a multilayer including the single layer and the indium oxide layer. The indium oxide layer may include, e.g., indium tin oxide (ITO), indium zinc oxide (IZO), indium tin zinc oxide (ITZO), and indium gallium zinc oxide (IGZO). The multilayer including the single layer and the indium oxide layer may include, e.g., an indium oxide layer/silver, an indium oxide layer/a silver alloy, an indium oxide layer/silver/an indium oxide layer, and an indium oxide layer/a silver alloy/an indium oxide layer. The silver alloy may include, e.g., silver (Ag) and nickel (Ni), copper (Cu), zinc (Zn), manganese (Mn), chromium (Cr), tin (Sn), palladium (Pd), neodymium (Nd), niobium (Nb), molybdenum (Mo), magnesium (Mg), tungsten (W), protactinium (Pa), aluminum (Al), or titanium (Ti).

In an implementation, a metal electrode may be provided under the thin film TF. In an implementation, the metal electrode may include, e.g., aluminum (Al), titanium (Ti), copper (Cu), iron (Fe), or the like. The metal electrode may be formed by stacking different metals. For example, the metal electrode may be formed by stacking alternatively titanium and aluminum.

When the metal electrode is provided under the thin film TF, an etchant composition other than the etchant composition according to an embodiment may be used. This is because the etchant composition according to an embodiment may selectively etch a single layer made of silver or a silver alloy as described above. For example, when the metal electrode is provided under a single layer made of silver or a silver alloy, etching may be performed to form the metal electrode before forming the thin film TF.

Figure 3C:
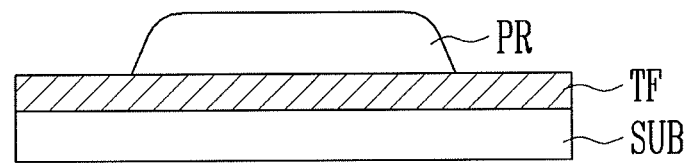

As shown in FIG. 3C, a mask PR may be formed on the thin film TF on the substrate SUB. In an implementation, the mask PR may be, e.g., a photoresist. The mask PR may be formed by coating a photosensitive composition on the thin film TF in the shape of a wiring to be formed and exposing the photosensitive composition. The photosensitive composition for forming the mask PR may include, e.g., norbornene/maleic anhydride copolymer, norbornene/maleate ester copolymer, methacrylate polymer having an alicyclic structure as a side chain, hydroxystyrene/acrylate copolymer, methacrylate copolymer, catechol derivative, or the like.

The mask PR may be formed by applying the photosensitive composition, prebaking, performing post exposure bake after UV irradiation, and patterning using an alkaline aqueous solution. The mask PR may be formed to have a wider width than a width of the wiring LP to be formed in consideration of a property of wet etching process.

Figure 3D:
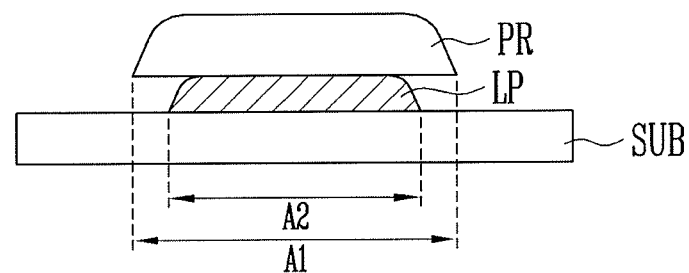

As shown in FIG. 3D, the thin film TF may be etched to form the wiring LP. At this time, a portion of the thin film TF under the mask PR is hardly etched to form the wiring LP, and another portion of the thin film TF in which the mask PR is not disposed is etched.

The width of the mask PR and the width of the wiring LP may be different from each other due to the property of wet etching. This is because the etchant composition remains in the space between the substrate SUB and the mask PR and the wiring LP may be etched more than intended when the wet etching is performed. The difference between the width of the mask PR and the width of the wiring LP is called a skew. As shown in FIG. 3D, the skew is the difference (A1–A2) between A1 and A2. When designing the wiring LP, the mask PR may be formed in consideration of the skew, but If the skew is larger, the shape of the wiring LP made may be different from the designed shape thereof. This may cause issues in a wiring LP having a complicated and fine structure.

When using an etchant composition including phosphoric acid, the skew may be relatively large. Therefore, when an etchant composition including phosphoric acid is used, the wiring LP could have a shape different from a designed shape. This may occur particularly in the region requiring the wiring LP of complicated and fine structure such as a pad unit.

The skew may be reduced by using the etchant composition according to an embodiment. When the wiring LP is formed using the etchant composition according to an embodiment, the size of the skew may be in a range of, e.g., less than about 0.36 µm. According to an embodiment, the skew may satisfy the range, and a wiring of a complicated and fine structure may be formed as designed.

When the thin film TF according to an embodiment is a multilayer including a single layer made of silver or a silver alloy and an indium oxide layer, an etching process for etching the indium oxide layer may be further performed. At this time, an etchant composition for etching the indium oxide layer is different from the etchant composition according to an embodiment. This is because the etchant composition according to an embodiment selectively etches only a single layer made of silver or a silver alloy. An etchant composition capable of etching an indium oxide layer may be selected without affecting a single layer made of silver or a silver alloy and the metal electrode under the single layer.

Figure 3E:
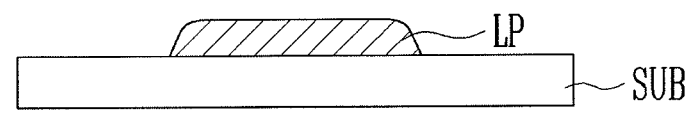

FIG. 3E shows a state in which the mask PR provided on the wiring LP is removed. The mask PR may be removed by a stripping process. The stripping process may be performed by dipping the wiring LP on which the mask PR is formed and the substrate SUB in a stripping solution. The mask PR that is in contact with the stripping solution may be swollen and then a swollen layer of the mask PR is removed, so that the mask PR may be removed from the wiring LP and the substrate SUB.

After the mask PR is stripped, a cleaning process may be further performed. In the cleaning process, the stripping solution and a residual etchant composition may be removed.

Figure 4:
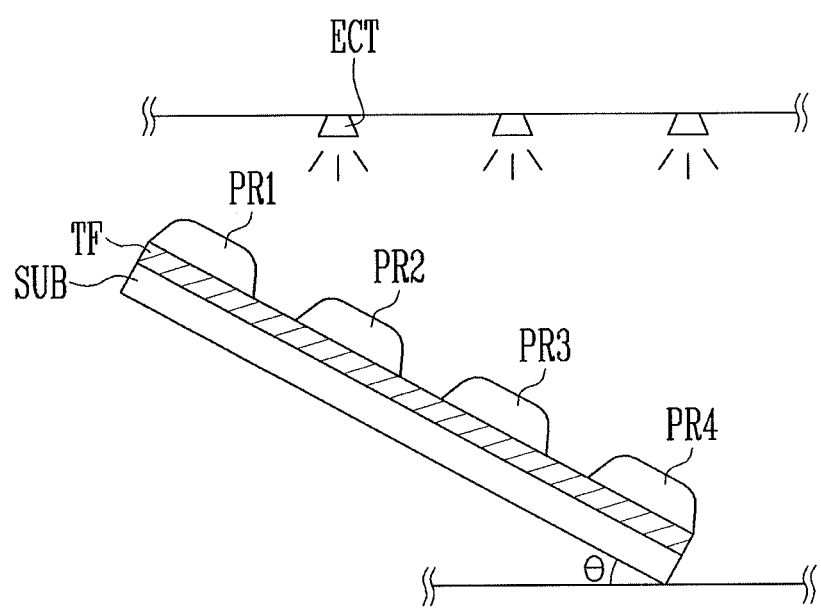
FIG. 4 illustrates a simplified view of a step etching a thin film in the method of forming a wiring according to an exemplary embodiment.

FIG. 4 illustrates a simplified view of a step etching a thin film in forming method of a wiring according to an exemplary embodiment.

According to an exemplary embodiment, in the etch process of the thin film TF, the substrate SUB and the thin film TF may be tilted at an angle of 0 to 60 degrees. The etching process may be performed while the substrate is inclined at the above angle, and thus the phenomenon that the etchant is accumulated on the substrate SUB may be prevented. Accordingly, the etching may be performed properly, and the liquid substitution to the etching by-products may be performed to help improve the process capability. In addition, when the substrate SUB is transported in an inclined state, the substrate SUB may be supported by an inclined lower guide roller, thereby preventing defects due to shaking of the substrate SUB.

However, when the substrate SUB and the thin film TF are etched while being inclined, the etching degree of the thin film TF may change depending on the position on the substrate SUB. For example, referring to FIG. 4, the etching degree of the thin film TF provided between the first mask PR1 and the second mask PR2 disposed relatively upward in the inclined direction may different from the etching degree of the thin film TF provided between the third mask PR3 and the fourth mask PR4 disposed downward in the inclined direction. For example, as the liquid etchant composition flows down in the inclined direction, more etchant compositions may be applied between the third mask PR3 and the fourth mask PR4 than between the first mask PR1 and the second mask PR2. The difference in the amount of applied etchant composition may cause a difference in the etching degree. At this time, the skew may be a measure for confirming the etching degree as described above. For example, the skew relatively more etched under the fourth mask PR4 may be larger than the skew under the first mask PR1. If the difference of the skew occurs depending on the position in the substrate SUB, the width of the wiring may be jagged. When the wiring has complicated and fine structure, a change in the width of the wiring depending on the position in the substrate SUB may cause the stability of the electrical connection by the wiring to deteriorate.

When an etchant composition including phosphoric acid is used, the difference of the skew may be large depending on the position in the substrate SUB. However, when the etchant composition according to an embodiment is used, the difference of the skew may be relatively small. Therefore, when the etchant composition according to an embodiment is used, the wiring may be formed to provide a stable electrical connection.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, the results of experiments of an etchant composition according to Examples and an etchant composition according to Comparative Examples will be described. The etchant composition according to the Examples and the Comparative Examples were formed in a composition ratio shown in Table 1. In Table 1, "%" means

TABLE 1

|  | Inorganic acid (%) | Glycol compound (%) | Nitrate compound (%) | Organic acid 1 (%) | Organic acid 2 (%) | Organic acid 3 (%) | Organic acid 4 (%) | Chelate compound (%) | Phosphate compound (%) |
| --- | --- | --- | --- | --- | --- | --- | --- | --- | --- |
| Example 1 | 5 | 9 | 5 | 25 | 10 | 10 | 5 | 3 | 0 |
| Example 2 | 10 | 9 | 5 | 25 | 10 | 10 | 5 | 3 | 0 |
| Example 3 | 5 | 12 | 5 | 25 | 10 | 10 | 5 | 3 | 0 |
| Example 4 | 5 | 9 | 10 | 25 | 10 | 10 | 5 | 3 | 0 |
| Example 5 | 5 | 9 | 5 | 35 | 10 | 10 | 5 | 3 | 0 |

TABLE 1-continued

|  | Inorganic acid (%) | Glycol compound (%) | Nitrate compound (%) | Organic acid 1 (%) | Organic acid 2 (%) | Organic acid 3 (%) | Organic acid 4 (%) | Chelate compound (%) | Phosphate compound (%) |
|---|---|---|---|---|---|---|---|---|---|
| Example 6 | 5 | 9 | 5 | 25 | 15 | 15 | 5 | 3 | 0 |
| Example 7 | 5 | 9 | 5 | 25 | 10 | 10 | 15 | 3 | 0 |
| Example 8 | 5 | 9 | 10 | 25 | 10 | 10 | 5 | 5 | 0 |
| Comparative Example 1 | 0.5 | 9 | 5 | 25 | 10 | 10 | 5 | 3 | 0 |
| Comparative Example 2 | 15 | 9 | 5 | 25 | 10 | 10 | 5 | 3 | 0 |
| Comparative Example 3 | 5 | 3 | 5 | 25 | 10 | 10 | 5 | 3 | 0 |
| Comparative Example 4 | 5 | 17 | 5 | 25 | 10 | 10 | 5 | 3 | 0 |
| Comparative Example 5 | 5 | 9 | 5 | 15 | 10 | 10 | 1 | 3 | 0 |
| Comparative Example 6 | 5 | 9 | 5 | 30 | 15 | 15 | 10 | 3 | 0 |
| Comparative Example 7 | 5 | 9 | 10 | 25 | 10 | 10 | 5 | 0.5 | 0 |
| Comparative Example 8 | 5 | 9 | 5 | 25 | 10 | 10 | 5 | 3 | 5 |

As for the etchant composition of the Comparative Examples, the composition of Comparative Example 1 included an inorganic acid less than a proper amount. The composition of Comparative Example 2 included an inorganic acid greater than a proper amount. The composition of Comparative Example 3 included a glycol compound less than a proper amount. The composition of Comparative Example 4 included a glycol compound greater than a proper amount. The composition of Comparative Example 5 included organic acids less than a proper amount. The composition of Comparative Example 6 included organic acids greater than a proper amount. The composition of Comparative Example 7 included a chelate compound less than a proper amount. Finally, the composition of Comparative Example 8 included phosphoric acid.

[Evaluation of Etching Property]

Table 2 shows the etch property of the etchant composition of the Examples and Comparative Examples according to Table 1 after the etch process. Evaluation of the etch property was performed on a sample including a triple layer of ITO/a single layer of silver (Ag)/ITO and a photoresist pattern.

The preferable range of an etching rate of silver (Ag E/R) is 300 Å/sec to 500 Å/sec. A skew of cut dimension (CD skew) on one side means the distance between the end of the photoresist and the end of the silver. A desired range of the CD skew on one side may be 0.3 μm to 0.35 μm. It may be desirable that no residue and precipitation exist.

TABLE 2

| | Etching characteristic | | | | |
|---|---|---|---|---|---|
| | Etch-rate (Å/sec) | CD-Skew (One-sided, μm) | Residue | Separating | Remarks |
| Example 1 | 380 | 0.3044 | Residue | Precipitation | |
| Example 2 | 420 | 0.3433 | Absence | Absence | |
| Example 3 | 384 | 0.3076 | Absence | Absence | |
| Example 4 | 416 | 0.3436 | Absence | Absence | |
| Example 5 | 370 | 0.3000 | Absence | Absence | |
| Example 6 | 434 | 0.3538 | Absence | Absence | |
| Example 7 | 400 | 0.3283 | Absence | Absence | |
| Example 8 | 400 | 0.3241 | Absence | Absence | |
| Comparative Example 1 | 280 | 0.2620 | Absence | Absence | |
| Comparative Example 2 | 530 | 0.4177 | Presence | Absence | |
| Comparative Example 3 | 285 | 0.2297 | Absence | Absence | |
| Comparative Example 4 | 526 | 0.3948 | Presence | Absence | |
| Comparative Example 5 | 250 | 0.2456 | Absence | Absence | |
| Comparative Example 6 | 666 | 0.4177 | Presence | Absence | |
| Comparative Example 7 | 395 | 0.3242 | Absence | Absence | Deterioration of aging ability |
| Comparative Example 8 | 450 | 0.5808 | Absence | Absence | Ag precipitation |

Referring to Table 2, in the case of the etchant according to Examples 1 to 8 and Comparative Example 7, the etching rate was in the range of 300 Å/sec to 500 Å/sec, the CD skew on one side was in the range of 0.3 μm to 3.5 μm, and the residue and precipitation were satisfactory. However, the composition of Comparative Example 7 showed deterioration of the aging ability due to lack of the chelate compound. The deterioration of the aging ability means that the etching property of the etchant composition was deteriorated in the repetitive etching process. Comparative Example 1, 3, and 5 did not exhibit desirable etching properties in all properties except the precipitation. Comparative Examples 2, 4, and 6 exhibited desirable etching properties for the residue and precipitation, but did not exhibit desirable etching properties for the etching rate and CD Skew of the single layer.

As shown in Table 2, in the case of the etchants according to Examples 1 to 8 and Comparative Examples 2, 4, 6 and 7, it may be seen that when the compositions for etching the single layer of silver were in a range enough to etching, no residue occurred, but when the compositions for etching the single layer were greater than a predetermined range, the CD skew on one side did not satisfy the range of 0.3 μm to 3.5 μm due to excessive etching.

As shown in the etching property according to Comparative Example 8, the etching rate of silver increased with the presence of phosphoric acid, thereby increasing the CD skew to a large extent and exceeding the preferable range of the CD skew. Therefore, Ag reductive precipitation occurred due to phosphoric acid.

[Evaluation of Reliability According to Increase of Processing Number of Etchant]

The evaluation of the processing number of substrates was performed on the etchant according to Example 1 as follows while increasing a concentration of a silver ion.

The reference etching was performed using the etchant of Example 1, and a silver powder was added by 200 ppm after the initial 300 ppm to perform an etching test. A result of the reference etching is compared with a result of the etching test after the addition of the silver powder, and the results are summarized in Table 3.

TABLE 3

|  | Reference | 300 ppm | 500 ppm | 700 ppm | 900 ppm |
| --- | --- | --- | --- | --- | --- |
| Etching rate (Ag E/R) | ◎ | ◎ | ◎ | ◎ | ◎ |
| CD Skew (One-sided) | ◎ | ◎ | ◎ | ◎ | X |
| Residue | ◎ | ◎ | ◎ | ◎ | X |
| Precipitation | ◎ | ◎ | ◎ | ◎ | ◎ |

◎: excellent (change within 10% with respect to reference)
x: bad (change over 10% with respect to reference)

Referring to Table 3, it may be seen that the change in the etching rate (Ag E/R), CD skew, residue, and precipitation were not large even when the concentration of the silver ion increased in the etchant composition of Example 1. Therefore, it may be seen that the etchant composition had reliability.

[Evaluation of Reliability According to Increase of Aging Time of Etchant]

The evaluation of the aging time was performed on the substrate by increasing the aging time of the etchant according to Example 1 as shown in Table 4.

The reference etching was performed using the etchant of Example 1, and the etchant etched repeatedly in an aging time of 2 hours to perform an etching test. The results were compared with the results of the reference as shown in Table 4.

TABLE 4

|  | Reference | 2 hour | 4 hour | 6 hour | 8 hour | 10 hour | 12 hour |
| --- | --- | --- | --- | --- | --- | --- | --- |
| Etching rate (Ag E/R) | ◎ | ◎ | ◎ | ◎ | ◎ | ◎ | ◎ |
| CD Skew (One-sided) | ◎ | ◎ | ◎ | ◎ | ◎ | ◎ | ◎ |
| Residue | ◎ | ◎ | ◎ | ◎ | ◎ | ◎ | ◎ |
| Precipitation | ◎ | ◎ | ◎ | ◎ | ◎ | ◎ | ◎ |

◎: excellent (change within 10% with respect to reference)
x: bad (change over 10% with respect to reference)

Referring to Table 4, it may be seen that the change in the etching rate (Ag E/R), CD skew, residue, and precipitation were not large even when the etchant composition 1 of Example 1 was used for a repetitive etching process with an increase in the aging time.

By way of summation and review, the thin film transistor array substrate may include gate lines for transmitting gate signals, data lines for transmitting data signals, and thin film transistors connected to the gate lines and the data lines. Each of the thin film transistors may be used as a switching element including a gate electrode extending from a corresponding gate line, a source electrode extending from a corresponding data line, a drain electrode facing the source electrode, and a semiconductor layer functioning as a channel. The above-described thin film transistor array substrate and related techniques have been variously developed. In addition, as the structure of the thin film transistor array substrate becomes more complicated, a process for forming a precise structure may be used. For example, an etching process may be capable of forming the structure of the gate electrode, the source electrode, the drain electrode, the semiconductor layer, and an etchant composition used therein.

An embodiment may provide a phosphoric acid-free etchant composition including no phosphoric acid ($H_3PO_4$).

In addition, according to an embodiment, the wiring of a complicated structure may be formed, and the wiring short-circuit, due to metal particles generated in a wiring formation process, may not occur.

DESCRIPTION OF SYMBOLS

| SUB: substrate | LP: wiring |
| --- | --- |
| TF: thin film | PR: mask |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a wiring, the method comprising:
    forming a thin film on a substrate, the thin film including a single layer made of silver or a silver alloy; and
    etching the single layer made of silver or silver alloy of the thin film in a predetermined wiring shape using the etchant composition,
    wherein the etchant composition is a phosphoric acid-free etchant composition that includes:
    about 40 wt % to about 60 wt % of an organic acid compound;
    about 6 wt % to about 12 wt % of a glycol compound;
    about 1 wt % to about 10 wt % of nitric acid, sulfuric acid, or hydrochloric acid;
    about 1 wt % to about 10 wt % of a nitrate salt compound; and
    water, all wt % being based on a total weight of the phosphoric acid-free etchant composition.

2. The method as claimed in claim 1, wherein the substrate is tilted to have an angle of about 0 to about 60 degrees during the etching of the thin film.

3. The method as claimed in claim 1, wherein the organic acid compound includes at least three different organic acids.

4. The method as claimed in claim 1, wherein the organic acid compound includes acetic acid ($CH_3CO_2H$), malic acid ($C_4H_6O_5$), citric acid ($C_6H_8O_7$), tartaric acid ($C_4H_6O_6$), lactic acid ($C_3H_6O_3$), methyl sulfonic acid ($CH_4O_3S$), formic acid ($CH_2O_2$), succinic acid ($C_4H_6O_4$), or fumaric acid ($C_4H_4O_4$).

5. The method as claimed in claim 1, further comprising forming a mask on the thin film according to a shape of the wiring, prior to etching the thin film.

6. The method as claimed in claim 1, wherein the thin film includes a single layer made of silver.

7. The method as claimed in claim 1, wherein the thin film includes a single layer made of a silver alloy.

8. The method as claimed in claim 1, wherein an etching time for etching the thin film is greater than or equal to two hours.

9. A method of forming a wiring, the method comprising:
forming a thin film on a substrate; and
etching the thin film in a predetermined wiring shape using the etchant composition,
wherein the etchant composition is a phosphoric acid-free etchant composition that includes:
about 40 wt % to about 60 wt % of an organic acid compound;
about 6 wt % to about 12 wt % of a glycol compound;
about 1 wt % to about 10 wt % of nitric acid, sulfuric acid, or hydrochloric acid;
about 1 wt % to about 10 wt % of a nitrate salt compound; and
water, all wt % being based on a total weight of the phosphoric acid-free etchant composition, wherein
the thin film includes a single layer made of silver or a silver alloy.

10. The method as claimed in claim 9, wherein
the thin film further includes a indium oxide layer, and
the indium oxide layer includes indium tin oxide (ITO), indium zinc oxide (IZO), indium tin zinc oxide (ITZO), or indium gallium zinc oxide (IGZO).

11. The method as claimed in claim 9, wherein the thin film includes an indium oxide layer/silver, an indium oxide layer/a silver alloy, an indium oxide layer/silver/an indium oxide layer, or an indium oxide layer/a silver alloy/an indium oxide layer.

12. The method as claimed in claim 9, wherein the silver alloy includes silver (Ag) and nickel (Ni), copper (Cu), zinc (Zn), manganese (Mn), chromium (Cr), tin (Sn), palladium (Pd), neodymium (Nd), niobium (Nb), molybdenum (Mo), magnesium (Mg), tungsten (W), protactinium (Pa), aluminum (Al), or titanium (Ti).

13. The method as claimed in claim 9, wherein the phosphoric acid-free etchant composition is formulated to etch a thin film including a single layer made of silver or a silver alloy.

14. The method as claimed in claim 9, wherein the organic acid compound includes at least three different organic acids.

15. The method as claimed in claim 9, wherein the organic acid compound includes acetic acid ($CH_3CO_2H$), malic acid ($C_4H_6O_5$), citric acid ($C_6H_8O_7$), tartaric acid ($C_4H_6O_6$), lactic acid ($C_3H_6O_3$), methyl sulfonic acid ($CH_4O_3S$), formic acid ($CH_2O_2$), succinic acid ($C_4H_6O_4$), or fumaric acid ($C_4H_4O_4$).

16. The method as claimed in claim 9, further comprising forming a mask on the thin film according to a shape of the wiring, prior to etching the thin film.

17. A method of forming a wiring, the method comprising:
forming a thin film on a substrate; and
etching the thin film in a predetermined wiring shape using the etchant composition,
wherein the etchant composition is a phosphoric acid-free etchant composition that includes:
about 40 wt % to about 60 wt % of an organic acid compound;
about 6 wt % to about 12 wt % of a glycol compound;
about 1 wt % to about 10 wt % of nitric acid, sulfuric acid, or hydrochloric acid;
about 1 wt % to about 10 wt % of a nitrate salt compound; and
water, all wt % being based on a total weight of the phosphoric acid-free etchant composition, wherein
the thin film includes a first layer made of silver or a silver alloy; and at least one second layer provided on or under the first layer and including indium oxide,
the method further includes etching the second layer,
the phosphoric acid-free etchant composition etches the first layer, and
an etchant for etching the second layer is different from the phosphoric acid-free etchant composition.

18. The method as claimed in claim 17, wherein the etchant for etching the second layer does not etch the first layer and the phosphoric acid-free etchant composition does not etch the second layer.

19. The method as claimed in claim 17, wherein the phosphoric acid-free etchant composition is formulated to etch a thin film including a single layer made of silver or a silver alloy.

* * * * *